(12) United States Patent
Ying

(10) Patent No.: US 6,646,419 B1
(45) Date of Patent: Nov. 11, 2003

(54) STATE OF CHARGE ALGORITHM FOR LEAD-ACID BATTERY IN A HYBRID ELECTRIC VEHICLE

(75) Inventor: Ramona Y. Ying, Rochester Hills, MI (US)

(73) Assignee: General Motors Corporation, Detroit, MN (US)

( * ) Notice: Subject to any disclaimer, the term of this patent is extended or adjusted under 35 U.S.C. 154(b) by 0 days.

(21) Appl. No.: 10/145,938

(22) Filed: May 15, 2002

(65) Prior Publication Data (65)

(51) Int. Cl.[7] .................................................. H02J 7/00
(52) U.S. Cl. ....................................... 320/132; 324/426
(58) Field of Search ................................. 320/132, 130, 320/149, 104, 136, 153, DIG. 21; 324/426, 427

(56) References Cited

U.S. PATENT DOCUMENTS 5,656,919 A * 8/1997 Proctor et al. .............. 320/152
5,949,219 A * 9/1999 Weiss .......................... 320/136
6,356,083 B1  3/2002 Ying ............................ 324/426
6,359,419 B1  3/2002 Verbrugge et al. .......... 320/132

* cited by examiner

Primary Examiner—Lawrence Luk
(74) Attorney, Agent, or Firm—Christopher DeVries (57) ABSTRACT

A method and apparatus for determining the state of charge of a lead-acid battery. The present invention includes steps to determine a current-based state of charge while accounting for such factors as current, temperature, charge efficiency, parasitic losses and self-discharge. The present invention is capable of measuring and/or calculating the open circuit voltage during and after operation to determine a voltage-based state of charge while compensating the open circuit voltage for its transient behavior and accounting for the voltage shift caused by charge events. The correlation of the open circuit voltage to the state of charge is dependent on the battery's mode of operation. The present invention is adaptive to battery aging by updating the battery resistance, correcting coulomb errors, and accounting for capacity degradation while in operation.

17 Claims, 4 Drawing Sheets

STATE OF CHARGE ALGORITHM FOR LEAD-ACID BATTERY IN A HYBRID ELECTRIC VEHICLE

TECHNICAL FIELD

The present invention outlines a method and apparatus to determine the state of charge (SOC) of a lead-acid battery operating in a hybrid electric vehicle (HEV).

BACKGROUND OF THE INVENTION

In today's automotive market, a variety of propulsion or drive technologies can be used to power vehicles. The technologies include internal combustion engines (ICEs), electric drive systems utilizing batteries and/or fuel cells as an energy source, and hybrid systems utilizing a combination of internal combustion engines and electric drive systems. Each propulsion system has specific technological, financial, and performance advantages and disadvantages, depending on the state of energy prices, energy infrastructure developments, environmental laws, and government incentives.

The increasing demand to improve fuel economy and reduce emissions in present vehicles has led to the development of advanced hybrid vehicles. Hybrid electric vehicles (HEV) are classified as vehicles having at least two separate power sources, typically an internal combustion engine and an electric traction motor. A hybrid electric vehicle will generally operate with a high-voltage battery pack ($\geq 42$ V) operating an electric motor running in conjunction with the ICE.

Hybrid vehicles, as compared to standard vehicles driven by an ICE, have improved fuel economy and consequently reduced emissions. During varying driving conditions hybrid vehicles will alternate between separate power sources, depending on the most efficient manner of operation of each power source. For example, a hybrid vehicle equipped with an ICE and an electric motor will shut down the ICE during a stopped or idle condition, allowing the electric motor to restart the ICE and eventually propel the vehicle, improving fuel economy for the hybrid vehicle.

Hybrid vehicles are broadly classified into series or parallel drive trains, depending upon the configuration of the drive trains. In a series drive train utilizing an ICE and an electric traction motor, only the electric motor drives the wheels of a vehicle. The ICE converts a fuel source to mechanical energy to turn a generator, which converts the mechanical energy to electrical energy to drive the electric motor. In a parallel hybrid drive train system, two power sources such as an ICE and an electric traction motor operate in parallel to propel a vehicle. Generally, a hybrid vehicle having a parallel drive train combines the power and range advantages of a conventional ICE with the efficiency and electrical regeneration capability of an electric motor to increase fuel economy and lower emissions, as compared with a traditional ICE vehicle.

Battery packs having secondary/rechargeable batteries are an important component of hybrid vehicle systems, as they enable an electric motor/generator (MoGen) to store braking energy in the battery pack during regeneration and charging by the ICE. The MoGen utilizes the stored energy in the battery pack to propel or drive the vehicle when the ICE is not operating. During operation, the ICE will be shut on and off intermittently, according to driving conditions, causing the battery pack to be constantly charged and discharged by the MoGen. The state of charge (SOC, defined as the percentage of the full capacity of a battery that is still available for further discharge) is used to regulate the charging and discharging of the battery.

Currently, the most cost-effective, commercially-ready battery for HEV applications is the lead-acid battery. Lead-acid batteries have been widely used in the automotive industry for starting-lighting-ignition applications in the last hundred years. However, in a hybrid application, the power loads and usage are much heavier than that used in previous lead-acid battery applications. To operate efficiently in HEV applications, a lead-acid battery needs to operate near its optimal SOC to maximize its discharge and charge power capabilities.

The discharge and charge reactions in the lead-acid battery are not symmetric, as in other battery technologies such as nickel-metal hydride and lithium-ion batteries. That is, the discharge battery resistance is typically lower than the charge battery resistance, which includes secondary gassing reactions at a SOC>60%. Consequently, it is difficult to predict the SOC based on charge voltages. Accordingly, a voltage-based SOC for a lead-acid battery is usually based on discharge data only. However, in a HEV application where there are continual regeneration events, the battery discharge voltages are shifted higher due to increased concentration of sulfuric acid after a charge. The present invention provides a method and apparatus to accommodate the effect of regeneration on the discharge voltage, and thus predict a more accurate and consistent SOC.

SUMMARY OF THE INVENTION

The present invention integrates three independent methods for determining the battery SOC of an electric or HEV during vehicle operation. The three independent methods include: a current-based SOC (ISOC) based on amp-hour (Ah) integration; a voltage-based SOC (VSOC) based on a calculated open circuit voltage (OCV); and a rest-based SOC (RSOC) based on a measured OCV after the vehicle has been powered-off. The present invention is optimized to determine the SOC of a lead-acid battery using factors uniquely relevant to a lead-acid battery. For example, the present ISOC method accommodates for charge inefficiency due to secondary gas reactions and current (Peukert) effect on the discharge capacity. The VSOC and RSOC calculations in the present invention consider the discharge data in predicting the OCV at any time during operation of a battery and compensate for regeneration effects.

The SOC determination of the present invention relies heavily on the VSOC and is adaptive to changes in the battery due to temperature and aging. The method of the present invention will periodically reset the ISOC to match the VSOC because of possible errors in amp-hour integration from small inaccuracies in current measurements and/or charge inefficiency of the battery over time. Furthermore, when the vehicle is off, a measured open circuit voltage can be correlated to the RSOC. The difference in the RSOC and the VSOC provides the basis for adaptation of battery pack capacity due to battery degradation resulting from hybrid cycling at partial SOCs and/or aging.

DESCRIPTION OF THE PREFERRED EMBODIMENT

Figure 1:
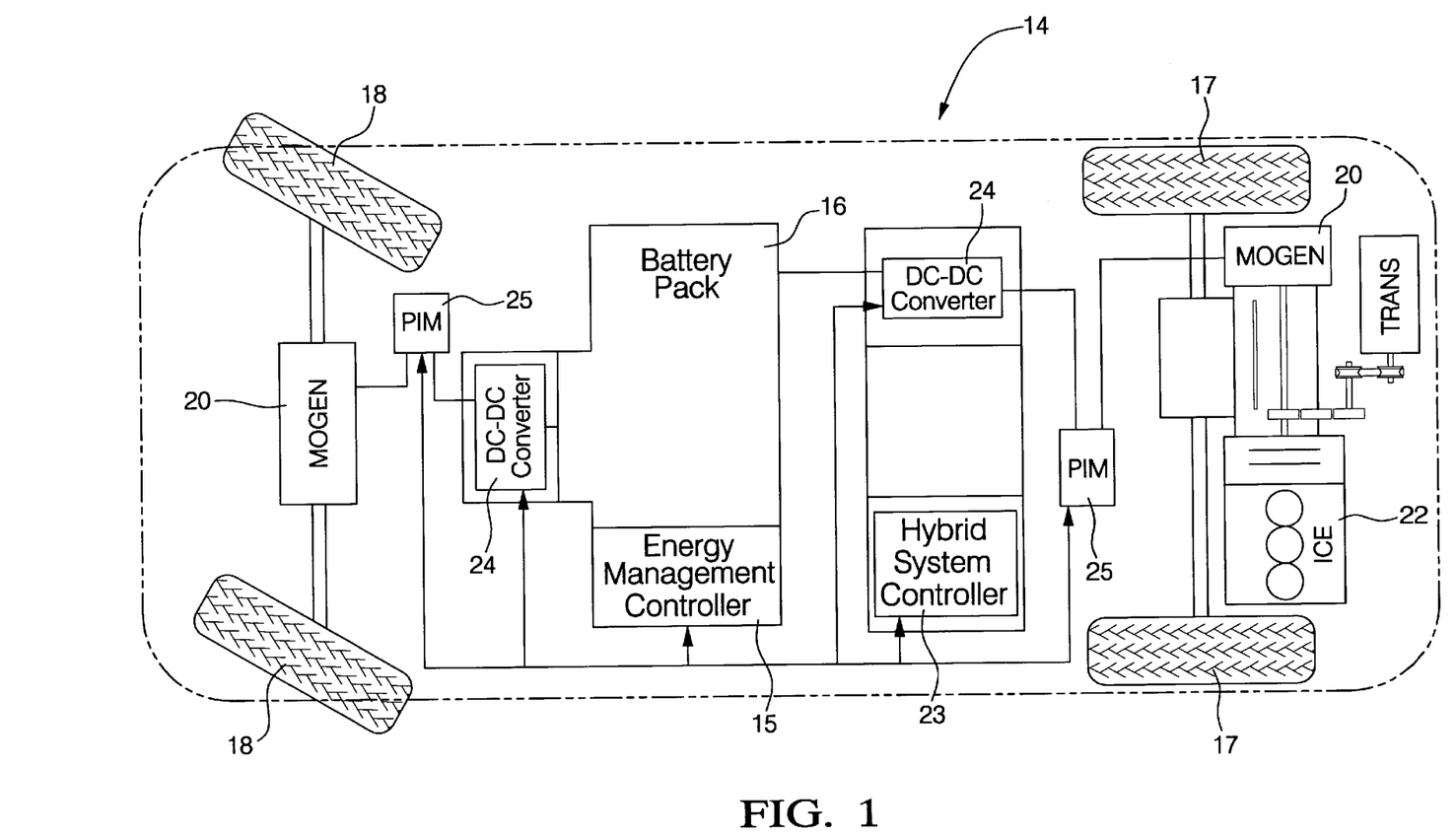
FIG. 1 is a diagrammatic drawing of the hybrid electric vehicle of the present invention.

FIG. 1 is a diagrammatic drawing of a hybrid vehicle 14 of the present invention. The hybrid vehicle 14 includes a battery pack 16 having a single battery module or individual battery modules. In the preferred embodiment, the battery pack 16 comprises a plurality of lead acid battery modules connected in series. In alternate embodiments of the present invention, the battery pack 16 may comprise any known battery technology including, but not limited to nickel metal hydride, lithium-ion, and lithium polymer batteries. An energy management controller (EMC) 15 monitors the current, voltage, state of charge (SOC), and power output of the battery pack 16.

A motor generator (MoGen) 20 is dynamically coupled to an internal combustion engine (ICE) 22 and functions as either a motor to propel the vehicle 14 or a generator to charge the battery pack 16, depending on the operating state of the vehicle 14 (i.e., braking, accelerating, or operating at a constant speed on a highway). The MoGen 20 is preferably an AC induction machine, but may comprise any known electrical motor/generator technology including, but not limited to DC machines, synchronous machines, and switched reluctance machines. MoGens 20 in the preferred embodiment are located on the rear of the vehicle to drive the rear wheels 17 and on the front of the vehicle to drive the front wheels 18.

The MoGens 20 are controlled by an electrical control system comprising a hybrid system controller 23, DC-DC converters 24 and power inverter modules (PIM) 25. The EMC 15 communicates with the hybrid system controller 23 and power inverter modules 25 by various digital and analog signals to provide voltage, current, and/or power output/input limits for the battery pack 16 based on a SOC measurement. In alternate embodiments of the present invention, the EMC 15, hybrid system controller 23, DC-DC converters 24, and power inverter modules 25 may be configured as a unitary system. The EMC 15 and hybrid system controller 23 may comprise any type of control module or vehicle controller known in the art and are equipped with nonvolatile memory (NVM), random access memory (RAM), discrete and analog input/output (I/O), a central processing unit, and communications interfaces for networking within an automotive communications network.

In generator mode, the MoGens 20 generate electrical energy that is transferred to the battery pack 16 and the DC-DC converters 24 by the EMC 15, controller 23 and inverter modules 25. The EMC 15, controller 23 and inverter modules 25 determine the direction of current flow for the MoGen 20, according to the vehicle 14 operating state. The DC-DC converters 24 provide and regulate the DC Bus that is pulse-width-modulated by the inverter modules 25 to supply time varying current to the MoGens 20. In a regeneration state (such as during braking) or charging condition, current will flow from the MoGens 20, via the inverter modules 25, to charge the battery pack 16 and provide current to the DC-DC converters 24. In a state where the MoGens 20 are needed to provide propulsion, current will flow from the battery pack 16 to the MoGens 20, via the DC-DC converters 24 and inverter modules 25, to power the MoGens 20.

In the preferred embodiment of the present invention, the SOC of the battery pack 16 is dynamically tracked to determine when to charge the battery pack 16. The EMC 15 and hybrid controller 23 of the present invention will control a battery pack's state-of-charge (SOC) near 50% to 70% so that the charge acceptance and efficiency during regenerative braking can be realized. However, controlling the battery pack 16 to any SOC percentage is within the scope of the present invention.

As discussed previously, the methods executed by the EMC 15 to determine the SOC of the battery pack 16 includes a current-based SOC method and measurement (ISOC), a voltage-based SOC method and measurement (VSOC), and a rest SOC method and measurement (RSOC).

Current-based SOC (ISOC) Method

Figure 2:
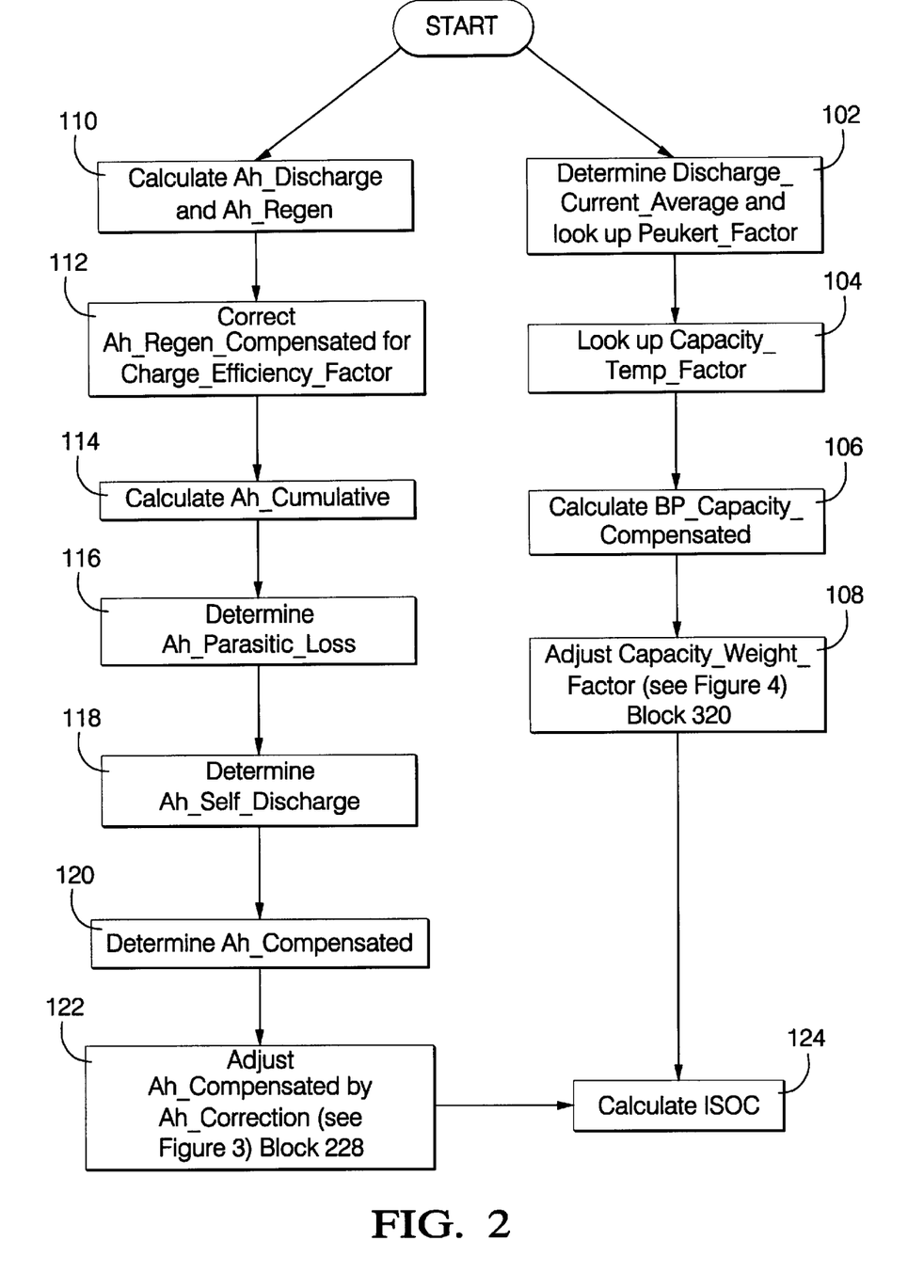
FIG. 2 is a flow chart of the current-based SOC method (ISOC)

FIG. 2 is a flow chart of the ISOC method of the present invention. The current-based SOC method uses the base equation defined as:

$$ISOC = \left(1 - \frac{Ah\_Compensated}{BP\_Capacity\_Compensated}\right) * 100\% \qquad [1]$$

to determine a current-based SOC. The term Ah_Compensated is an accurate amp-hour count of the charge going in and out of the battery pack 16 starting from a fully-charged state, and the term BP_Capacity_Compensated is the usable capacity of the battery pack 16. Ah_Compensated is bounded between zero at 100% SOC and BP_Capacity_Compensated at 0% SOC. The sign convention in the present invention is written as negative for discharge and positive for charge. Accordingly, the sign of both Ah_Compensated and BP_Capacity_Compensated is negative. They are compensated for various factors such as current, temperature, charge efficiency, parasitic losses, and self-discharge, as will be described later in the specification.

Because the capacity of a lead-acid battery is dependent on the discharge current known as the Peukert effect, it is pertinent to determine the capacity at various discharge rates. The battery pack 16 capacity will change depending on the most recent average discharge current, such as a discharge current measured in the last five minutes. For example, if the battery pack 16 had been initially discharging at a fast rate and then switched to a slower rate, more capacity would be available at the slower rate. Even a rest period can increase the battery pack's 16 discharge capacity. Starting at block 102 in FIG. 2, an average discharge current may be determined from primarily the discharge portion of the drive cycle. The average discharge current should be representative of the rate at which the battery pack 16 capacity is being removed. Therefore, the time period over which the cumulative discharge is summed should be sufficient to reflect the recent discharge history of the battery pack 16 such as approximately five minutes. Also, the time constants for updating the average discharge current should be long enough such that the average discharge current is not constantly changing. The formula used in block 102 to calculate the average discharge current is:

$$Discharge\_Current\_Average = \frac{\sum_i (Discharge\_Ah)_i}{\sum_i (Discharge\_time)_i} \qquad [2]$$

where Discharge_Current_Average is the average discharge current for the battery, Discharge_Ah is the integrated amp-hour using the measured discharge currents, and Discharge_time is the time period over which the Discharge_Ah is measured.

For approximately the first five minutes of discharge, the initial average discharge current should be set to the average discharge current from the previous driving cycle. If the average discharge current from the previous driving cycle is not available, the default value can be set to the C-rate, which is defined as the discharge current needed to deplete the capacity of the battery back 16 in approximately one hour.

Typically, the battery capacity discharged at the C-rate is considered the usable capacity in a HEV application and is defined as BP_Capacity_Default at a reference temperature such as 25° Celsius. To compensate for the effect of discharge current and temperature, a Peukert factor or Peukert_Factor is introduced in block 102 and a temperature compensation factor for the battery capacity or Capacity_Temp_Factor is introduced in block 104 by using look-up tables or formulas. The BP_Capacity_Compensated calculation in block 106 uses the following formula:

$$BP\_Capacity\_Compensated = BP\_Capacity\_Default * Peukert\_Factor * Capacity\_Temp\_Factor \quad [3]$$

The Peukert_Factor is based on the Peukert Equation:

$$(I_{D,avg})^n * t = C \quad [4]$$

where $I_{D,avg}$ is the Discharge_Current_Average, n is the Peukert slope, t is the total discharge time, and C is a constant. For a lead-acid battery, the Peukert slope n is typically between 1.1 and 1.3 at 25° C. and is a function of temperature. The Peukert slope usually increases with decreasing temperatures. Thus, the Peukert relationship needs to be characterized for the selected battery in the temperature range of vehicle operation.

If the BP_Capacity_Default is based on a C-rate discharge (i.e., $I_{D,avg,1}$=C-rate), then the Peukert_Factor can be calculated for a different Discharge_Current_Average, $I_{D,avg,2}$, by $$Peukert\_Factor = (I_{D,avg,1}/I_{D,avg,2})^{n-1}$$

or $$Peukert\_Factor = (C\text{-rate}/Discharge\_Current\_Average)^{n-1} \quad [5]$$

The Peukert relationship characterized at different temperatures can also provide the Capacity_Temp_Factor, which takes into account the effect of temperature on the battery capacity. Using the C-rate capacities at different temperatures, $$Capacity\_Temp\_Factor\ (T) = Battery\_Capacity\ (T)/BP\_Capacity\_Default\ (25°\ C.) \quad [6]$$

Figure 4:
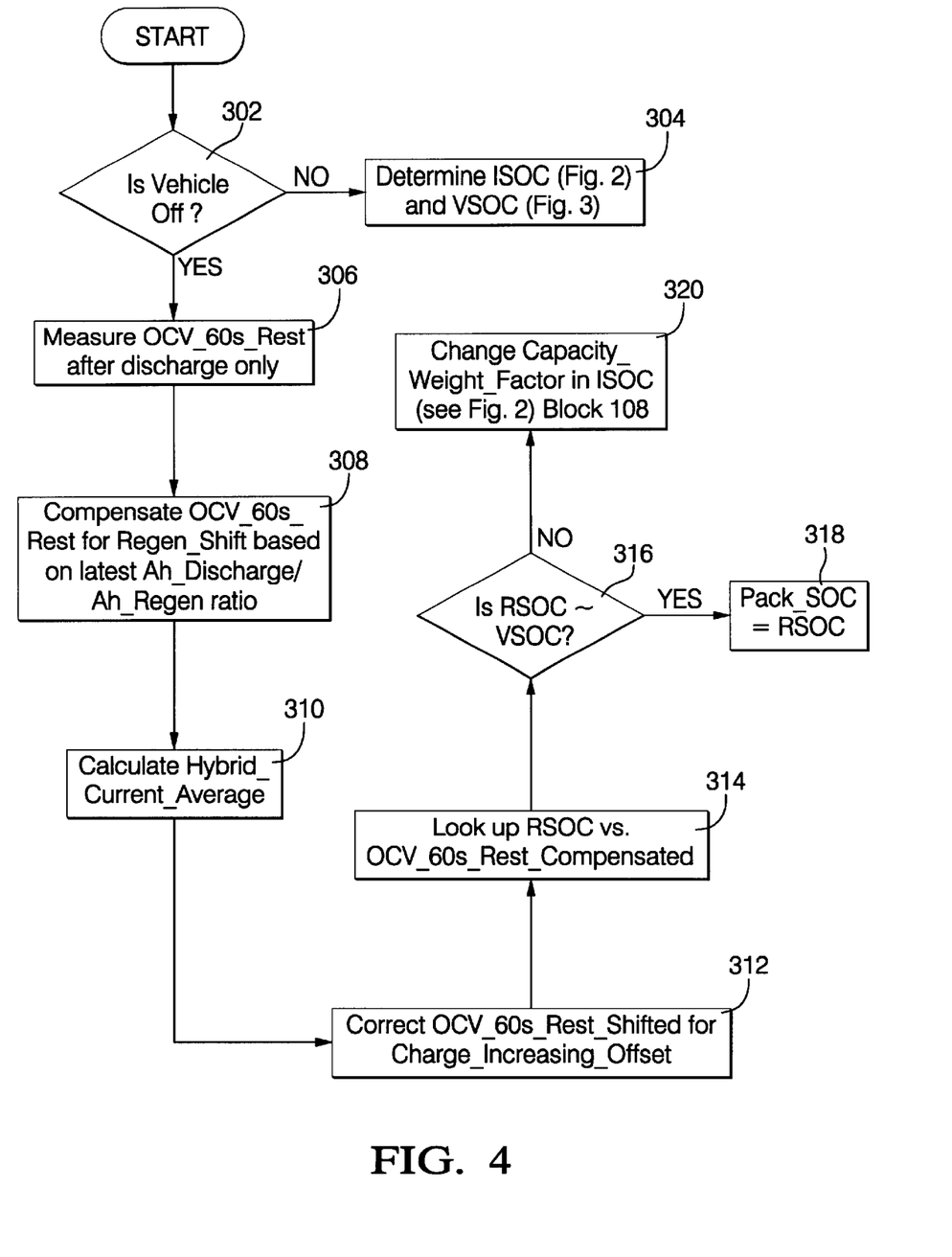
FIG. 4 is a flow chart of the rest-based SOC method (RSOC).

Block 108 then adjusts the Capacity_Weight_Factor, which will be discussed in conjunction with FIG. 4.

Besides having an accurate prediction of the battery pack 16 capacity, it is important to have an accurate amp-hour count of the charge going in and out of the battery pack 16 to determine an accurate ISOC. Numerous sources of uncertainty such as charge inefficiency due to secondary gassing reactions, parasitic losses, and self-discharge exist. Errors generated by these sources of uncertainty may be mitigated by using various methods of compensation.

Referring to FIG. 2 at block 110, the uncorrected amp-hour counts are added separately for discharge and charge (regeneration). The following terms are calculated for discharge currents, I<0:

$$Ah\_Discharge_i = (I_i + I_{i-1})/2 * (t_i - t_{i-1}) \quad [7]$$

and for charge currents, I>0:

$$Ah\_Regen_i = (I_i + I_{i-1})/2 * (t_i - t_{i-1}) \quad [8]$$

where Ah_Discharge is the amp-hour count for a battery pack 16 from discharge and Ah_Regen is the amp-hour count for a battery pack 16 from charge or regeneration.

Because of possible secondary gassing reactions during regeneration, particularly at a SOC>60%, not all charge current will go towards active material conversion. A charge efficiency factor, Charge_Efficiency_Factor, is introduced at block 112 as a function of the battery pack 16 SOC, Pack_SOC, and regeneration current, Regen_Current. The Charge_Efficiency_Factor is generally lower at high Pack_SOC and high Regen_Current. Accordingly, the compensated amp-hour counts during regeneration, $Ah\_Regen\_Compensated_i$, is calculated by the following formula:

$$Ah\_Regen\_Compensated_i = Charge\_Efficiency\_Factor * Ah\_Regen_i \quad [9]$$

At block 114, the cumulative amp-hours, Ah_Cumulative, are totaled by the following formula:

$$Ah\_Cumulative = \Sigma(Ah\_Discharge_i + Ah\_Regen\_Compensated_i) \quad [10]$$

Note: Because of the sign convention, $Ah\_Discharge_i$ is negative and $Ah\_Regen\_Compensated_i$ is positive.

During a prolonged rest, the battery pack 16 loses additional capacity from parasitic drains due to electronic equipment on-board the vehicle and from self-discharge. These losses are considered in the amp-hour count in blocks 116 and 118. The amp-hour parasitic losses, Ah_Parasitic_Loss, are calculated by the following formula at block 116:

$$Ah\_Parasitic\_Loss = Parasitic\_Rate * Rest\_Time \quad [11]$$

where Parasitic_Rate is negative and needs to be pre-determined for the specific vehicle electrical loads during off time, and Rest_Time is the total time when the vehicle is not in operation. The self-discharge rate of the battery, Self_Discharge_Rate, is dependent on the battery's SOC and temperature and needs to be pre-determined for the selected battery. The amp-hour self-discharge losses, Ah_Self_Discharge, are calculated by the following formula in block 118:

$$Ah\_Self\_Discharge = Self\_Discharge\_Rate * Rest\_Time \quad [12]$$

Note: The amp-hours associated with parasitic drains and self-discharge are negative because they are depleting the battery.

After compensating for charge efficiency, parasitic and self-discharge losses, the compensated amp-hour count, Ah_Compensated, in block 120 may be calculated by the formula:

$$Ah\_Compensated = Ah\_Cumulative + Ah\_Parasitic\_Loss + Ah\_Self\_Discharge \quad [13]$$

Because of small errors in the amp-hour count, parasitic loss and self-discharge calculations building up over time as well as changes in the battery pack 16 capacity occurring with age, periodic adjustments of both the numerator and denominator in equation [1] are needed. The amp-hour correction, Ah_Correction, at block 122 and Capacity_Weight_Factor in block 108 accommodate these errors based on differences in the SOCs determined by the three methods. Blocks 122 and 108 will be further described in conjunction with FIGS. 3 and 4, respectively. Thus, at block 124, the ISOC for the battery pack 16 may be determined by the formula:

$$ISOC = \left(1 - \frac{Ah\_Compensated + Ah\_Correction}{BP\_Capacity\_Compensated * Capacity\_Weight\_Factor}\right) * 100\% \quad [14]$$

where the default Ah_Correction is initially zero and Capacity_Weight_Factor is initially one. The Ah_Correction is adjusted based on the difference between the VSOC and the ISOC while the Capacity_Weight_Factor is based on the difference between the VSOC and the RSOC. These adjustments are discussed in the VSOC and the RSOC portions of the present specification. Large fluctuation in these factors can be avoided by limiting the allowable rate of change for these factors.

Voltage-based SOC (VSOC) Method During Discharge

It is well known that the open circuit voltage (OCV) of a lead-acid battery is dependent on the sulfuric acid concentration at the electrode surfaces, which correlates to a lead-acid battery's SOC. However, the SOC versus OCV correlation is dependent on several factors such as the prior current and time at which the OCV is measured. In an HEV application, there are continual regeneration events, which can further complicate the correlation. The voltage-based SOC method of the present invention is shown in a flow chart in FIG. 3.

Figure 3:
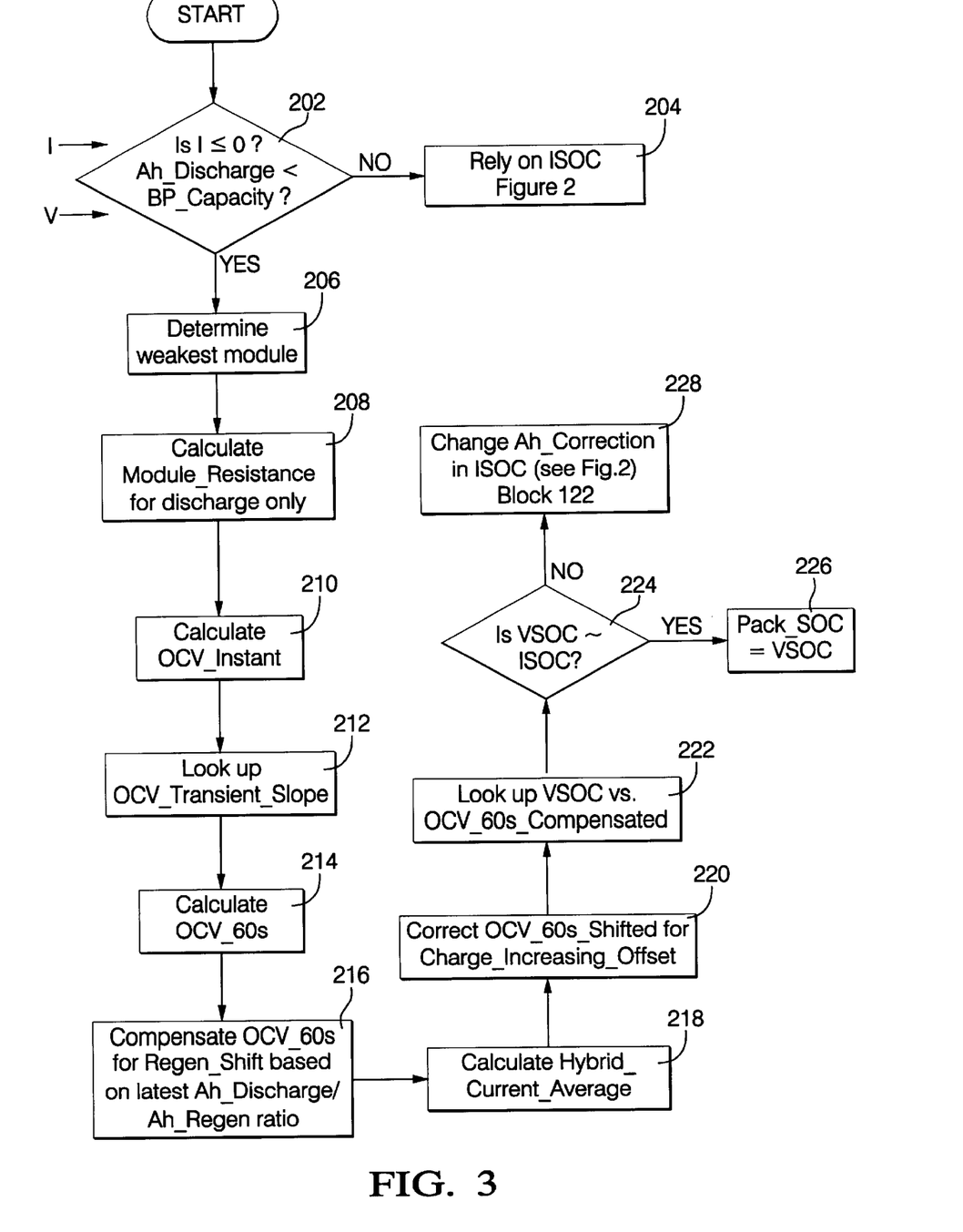
FIG. 3 is a flow chart of the voltage-based SOC method (VSOC)

The VSOC calculation is deactivated under certain conditions as shown at the start of the VSOC flow chart at block 202. First, the VSOC measurement for the present invention is determined using discharge data only. For charge (i.e., I>0), the present invention at block 204 will rely on the ISOC calculation to determine the SOC of the battery pack 16. During charge, the module resistance includes an added complexity associated with the secondary gassing reactions occurring at the electrodes. The gassing polarizations can be substantially larger than the activation polarization particularly at a SOC>60%; therefore, the gassing polarizations are difficult to account for in the OCV back-calculation. Accordingly, the voltage-based SOC uses the discharge and not regeneration data in the VSOC determination. The SOC determination of the battery pack 16 should rely on ISOC during regeneration events. Low discharge currents may also back-calculate to an abnormally high OCV particularly after a regeneration event because of their low polarization voltages. Therefore, for low discharge currents whose magnitude is less than the C-rate, the VSOC will not be updated.

The VSOC of the present invention is preferably not determined for the battery pack 16 after long rests when the sulfuric acid at the electrode surface has equilibrated with the bulk electrolyte. The additional polarization associated with the diffusion of the sulfuric acid back to the electrode surface will give a false, lower SOC reading. The VSOC of the present invention is preferably deactivated initially until the conditions at the electrode surfaces stabilize, which can be until the magnitude of the Ah_Discharge is greater than the BP_Capacity as also indicated in block 202. The SOC determination of the battery pack 16 in the present invention should rely on the ISOC when the VSOC is deactivated.

The SOC of the worst performing battery module in the battery pack 16 will dictate the SOC of the battery pack 16. Referring to FIG. 3, the weakest battery module of the battery pack 16 is determined at block 206. Accordingly, the lowest module's voltage and corresponding current are used to determine the VSOC. The lowest module is selected by comparing each module voltage with a calculated normalized module voltage. The normalized module voltage uses values of pack voltage and pack current that are synchronized with the module voltages being evaluated. The total strap resistances, Total_Strap_Resistance, between the modules in the battery pack are also measured. The normalized module voltage, Module_Voltage_Normalized, and the difference in module voltage, Module_Voltage_Delta, for each module are calculated by the following equations:

Module_Voltage_Normalized=((Pack_Voltage−(Total_Strap_Resistance*Current))/Module_Number [15]

Module_Voltage_Delta=(Module_Voltage_Normalized−Module_Voltage) [16]

where Module_Number is the total number of modules in battery pack 16 and Module_Voltage is the voltage for each separate battery module. The battery module with the highest Module_Voltage_Delta is selected as the lowest module. This module is used to determine the VSOC. The current-voltage data for this module are synchronous.

To correlate to the VSOC, it is preferable to use a measured OCV after a discharge pulse greater than C-rate in magnitude. When available during vehicle operation, the instantaneous OCV is recorded (such as measured 0.2 second after the current load is removed) and the method of the present invention proceeds to block 212 to factor in the OCV transient behavior.

However, during most vehicle operation, the battery pack 16 is usually under a load, so it is difficult to measure the OCV directly. Fortunately, the OCV can be calculated if the battery module resistance is known:

$$V{-}OCV = I * Module\_Resistance \quad [17]$$

Since the resistance of each battery module, Module_Resistance, is dependent on SOC, module temperature, and module age, the battery module resistance is continually updated during vehicle operation by dividing delta V by delta I at short time periods ($\leq 1$ second, preferably 0.2 second) at block 208 using the equation:

$$Module\_Resistance_i = \frac{V_i - V_{i-1}}{I_i - I_{i-1}} \quad [18]$$

The Module_Resistance is an overall battery resistance associated with the electrochemical reactions occurring at the positive and negative plates including ohmic, crystallization, activation (kinetics), and concentration (diffusion) resistances. Equation 18 assumes that the Module_Resistance$_i$ and OCV have not changed significantly in the time interval, $t_i - t_{i-1}$. This is generally true for very short periods such as 0.2 second. It is important that a consistent time interval be used to calculate the Module_Resistance$_i$ because the battery voltage changes continually with time.

Furthermore, the Module_Resistance$_i$ is calculated for discharge currents whose magnitude is greater than the C-rate. The module resistance is not updated if the current difference is very small (e.g., delta I<C/5), low discharge currents, and charge currents. In these situations, the previous module resistance value should be used. To prevent large fluctuations, the resultant Module_Resistance$_i$ value may be filtered, changed gradually, and bounded between its 100% SOC impedance @ 1000 Hz and five times that initial value.

At block 210, the open circuit voltage, OCV_Instant, is calculated from the Module_Resistance$_i$ using the following equation:

$$OCV\_Instant = V_i - (I_i * Module\_Resistance_i) \qquad [19]$$

For a time interval of 0.2 second when the Module_Resistance$_i$ is measured, the OCV_Instant versus SOC correlation is dependent on the magnitude of the prior discharge current. If the OCV_Instant is allowed to relax for a longer time period, such as for one minute, the SOC-OCV correlation is less dependent on the prior discharge current. The OCV transient behavior may be characterized for a time period of a minute or longer after different discharge currents and SOC.

When a current load is removed, the OCV value changes logarithmically with time, $$OCV(t) = OCV\_Transient\_Slope * \ln(t) + OCV\_1s \qquad [20]$$

where t is time in seconds and OCV_Transient_Slope and OCV_1s are fitted parameters of the measured OCV plotted against rest time. This transient behavior is associated with the diffusion of the sulfuric acid between the electrode surface and bulk electrolyte. The OCV_Tansient_Slope indicates the direction and rate at which the OCV relaxes to its semi-steady state value. The correlation coefficients from these curve fits are usually greater than 0.98. Following a discharge pulse, the OCV relaxes to a higher value, so the transient slope is positive. Whereas following a charge pulse, the OCV relaxes to lower value, and the transient slope is negative. Block 212 contains a look-up table of the pre-determined OCV_Transient_Slope values as functions of both the prior discharge current and SOC.

Equation 20 allows the OCV to be calculated for any time, $t_2$, once an instantaneous OCV is measured or calculated at $t_1$, $$OCV(t_2) = OCV(t_1) + OCV\_Transient\_Slope * \ln(t_2/t_1) \qquad [21]$$

where for instance, $t_1$=0.2s when OCV_Instant is calculated or measured and $t_2$=60s when the SOC versus OCV correlation is calibrated.

The OCV_Transient_Slope is also a function of temperature and can be temperature-compensated by the OCV_Transient_Slope_Temp_Factor. Accordingly, the compensated open circuit voltage transient slope may be determined by the formula:

$$OCV\_Transient\_Slope\_Compensated = OCV\_Transient\_Slope\_Temp\_Factor * OCV\_Transient\_Slope\_25C \qquad [22]$$

Once the OCV_Instant is calculated from equation [19] and the OCV_Transient_Slope_Compensated is determined, the OCV is calculated for the time period (such as 60 seconds) used to calibrate the SOC versus OCV correlation at block 214 using the equation:

$$OCV\_60s = OCV\_Instant + OCV\_Transient\_Slope\_Compensated * \ln(60/Instant\_time) \qquad [23]$$

In the preferred embodiment of the present invention, Instant_time is 0.2 second and calibration time is 60 seconds.

At block 216, the OCV_60s is compensated for the voltage shift caused by charge or regeneration events. During charge, sulfuric acid is being produced at the electrode; therefore, the local concentration of sulfuric acid is high causing the voltage to be high when discharge is initialized. As the sulfuric acid is being consumed during the discharge, the voltage settles back down to a point when it can be calibrated to the SOC (i.e., when −Ah_Discharge/Ah_Regen≧1). This ratio Ah_Discharge/Ah_Regen is updated every time charge occurs.

For −Ah_Discharge/Ah_Regen<1, the OCV_60s is compensated for the regeneration shift by the formula:

$$OCV\_60s\_Shifted = OCV\_60s + \left(1 - \frac{Ah\_Discharge}{Ah\_Regen}\right) * Regen\_Shift \qquad [24]$$

where Ah_Discharge and Ah_Regen are the coulomb counts of the present discharge and prior regeneration pulses, and Regen_Shift is negative to shift the OCV lower. Note that there is no Regen_Shift correction when −Ah_Discharge/Ah_Regen≧1.

The Regen_Shift has been found to be dependent on the magnitude of the prior regeneration current and SOC. With the exception of low and high SOCs, the Regen_Shift is fairly constant between 20% and 80% SOC range, where most hybrid battery operation occurs.

If the OCV_60s_Shifted fluctuates significantly over a short period of time (such as one to five minutes), a smoothing technique such as averaging may be used to get an OCV_60s_Shifted_Average.

The correlation of the OCV to SOC can be pre-determined from OCV measurements following a range of discharge pulses at different SOC. To maintain SOC during these measurements, each discharge/rest pulse should be followed by an equivalent charge/rest pulse. For example, at each SOC, voltage measurements can be made for pulses of 10-second discharge/60 second rest/10 second charge/60 second rest for currents ranging from C-rate to 10 C-rate. The 60-second OCV following the discharge pulses would be correlated to the SOC, thus generating a SOC–OCV calibration curve, which can be described as a fitted equation or in a look-up table. A set of SOC–OCV calibration curves shall be pre-determined for a variety of conditions including, but not limited to temperature and battery aging.

Because of the voltage hysteresis effect, the SOC versus OCV relationship is dependent on whether the battery pack 16 is operating in a charge decreasing or charge increasing mode. To assess the degree of voltage hysteresis, the SOC–OCV calibration curves are determined separately for a charge decreasing and a charge increasing operation at different temperatures. The voltage difference between the charge decreasing and charge increasing SOC–OCV calibration curves is fairly constant, so it may be more convenient to use one SOC–OCV calibration curve for each temperature rather than both. Therefore, if the charge decreasing SOC–OCV calibration curve is selected, then an offset can be used to shift any charge increasing data to the charge decreasing calibration curve.

A Hybrid_Current_Average is defined in block 218 to determine the mode of battery operation. It can be calculated by dividing the cumulative (discharge and charge) amp-hour by time and updated by a time interval such as every five minutes. If the Hybrid_Current_Average is zero, the battery pack 16 is in a charge-sustaining mode of operation. If the Hybrid_Current_Average is less than zero, the battery pack 16 is in a charge decreasing mode, and if the Hybrid_Current_Average is greater than zero, the battery pack 16 is in a charge increasing mode.

Accordingly at block 220, for a charge increasing operation (i.e., Hybrid_Current_Average>0), a charge increasing offset, Charge_Increasing _Offset, may be introduced to shift the OCV_60s_Shifted_Average from the charge increasing calibration curve to the charge decreasing one using the equation:

$$OCV\_60s\_Compensated = OCV\_60s\_Shifted\_Average + Charge\_Increasing\_Offset \qquad [25]$$

The Charge_Increasing_Offset is zero for charge decreasing or charge sustaining data (i.e., Hybrid_Current_Average≦0). OCV_60s_Compensated is correlated to VSOC using the charge decreasing SOC–OCV calibration curve, which is a function of temperature and battery aging, in block 222.

The VSOC and the ISOC are compared at block 224. If the VSOC is similar to the ISOC, the battery pack SOC or Pack_SoC is set equal to the VSOC to be used as the correct SOC for the battery back 16 in block 226. If the VSOC and the ISOC are not similar, then there will be a correction using Ah_Correction for the ISOC value at block 228.

The Ah_Correction is based on the difference between the VSOC and the ISOC. The initial or default Ah_Correction=0 and is adjusted by $$Ah\_Correction = (ISOC - VSOC) * BP\_Capacity\_Compensated \quad [26]$$

Rest-based SOC (RSOC) Method Based on Measured OCV

The SOC can be adjusted when there is an opportunity to measure a true OCV. FIG. 4 is a flow chart of the Rest-based SOC method of the present invention. At block 302, if the vehicle 14 is on, then the ISOC and the VSOC will be determined at block 304 as previously described, and the RSOC method will not be executed. If the vehicle 14 is off, then at the end of vehicle operation in block 306, the control module shall record the OCV of the lowest module at 60 seconds, OCV_60s_Rest, after the last current pulse (preferably discharge). A large discharge (>C-rate) pulse will give a relatively better SOC correlation than a charge current. Similar to the VSOC method above, the OCV_60s_Rest may need to be shifted based on the latest ratio −Ah_Discharge/Ah_Regen (<one). At block 308 the OCV rest value, OCV_60_Rest_Shifted, is shifted using the following equation:

$$OCV\_60s\_Rest\_Shifted = \\ OCV\_60s\_Rest + \left(1 - \frac{Ah\_Discharge}{Ah\_Regen}\right) * Regen\_Shift \quad [27]$$

No Regen_Shift is necessary if −Ah_Discharge/Ah_Regen≧one.

Using the prior Hybrid_Current_Average to determine if the battery pack 16 is charge decreasing or charge increasing at block 310, the OCV_60s_Rest_Compensated is determined at block 312 based on the equation:

$$OCV\_60s\_Rest\_Compensated = OCV\_60s\_Rest\_Shifted + Charge\_Increasing\_Offset \quad [28]$$

where Charge_Increasing_Offset is zero for charge decreasing or charge sustaining operation. At block 314, the RSOC is determined by using the OCV_60s_Rest_Compensated based on the SOC–OCV calibration curve depending on the temperature and battery age.

The RSOC is compared with the VSOC at block 316. If they are similar, then the battery pack 16 SOC is set to the RSOC at block 318. However, if they are dissimilar, then the Capacity_Weight_Factor (Range=0.2–1.2) is determined based on the difference between the VSOC and the RSOC. The initial or default Capacity_Weight_Factor=1.0 and is adjusted in block 320 in FIG. 4 by $$Capacity\_Weight\_Factor = \left(\frac{1 - VSOC}{1 - RSOC}\right) \quad [29]$$

During vehicle operation, the SOC algorithm relies heavily on the VSOC as the Pack_SOC. In the ISOC calculation, there are two sources of error in the Ah_Compensated and BP_Capacity_Compensated values. The SOC strategy incorporates an Ah_Correction and/or Capacity_Weight_Factor adjustments to accommodate for differences in the SOCs determined by the three methods. However, under certain circumstances, VSOC is not valid.

To summarize, for low discharge currents, all charge currents, and after prolong rests:

$$Pack\_SOC = ISOC \quad [30]$$

For large discharge currents greater than the C-rate:

$$Pack\_SOC = VSOC \quad [31]$$

When there is a large discharge pulse prior to the end of vehicle operation:

$$Pack\_SOC = RSOC \quad [32]$$

While this invention has been described in terms of some specific embodiments, it will be appreciated that other forms can readily be adapted by one skilled in the art. Accordingly, the scope of this invention is to be considered limited only by the following claims.

What is claimed is:

1. A method of determining the state of charge of a battery comprising:
   integrating the charge going in and out of the battery to determine a current based state of charge measurement;
   compensating the current based state of charge measurement using a Peukert factor; and
   measuring the open circuit voltage to determine a voltage based state of charge measurement; and
   compensating the current based state of charge measurement based on the voltage based state of charge measurement.

2. The method of claim 1 wherein said battery is a lead acid battery.

3. The method of claim 1 wherein the Peukert factor is determined using the average discharge current of the battery.

4. The method of claim 1 further comprising the step of determining parasitic losses for the battery and compensating the current based state of charge measurement based on the parasitic losses.

5. The method of claim 1 further comprising the step of determining the self discharge of the battery and compensating the current based state of charge measurement based on the self discharge of the battery.

6. A method of determining the state of charge of a lead acid battery comprising:
   integrating coulombs charging and discharging the battery to determine a first state of charge measurement;
   adjusting the first state of charge measurement using a Peukert factor;
   measuring the open circuit voltage to determine a second state of charge measurement;
   determining the operation of the battery and using the first state of charge or second state of charge measurement as the actual state of charge measurement based on the operation of the battery.

7. The method of claim 6 further comprising compensating the first state of charge measurement for temperature effects.

8. The method of claim 6 further comprising compensating the first state of charge measurement based on charge efficiency variations caused by regeneration of the lead acid battery.

9. The method of claim 6 further comprising the step of compensating the first state of charge measurement by comparing the first state of charge measurement to the second state of charge measurement.

10. The method of claim 6 further comprising compensating the first state of charge measurement based on battery capacity degradation.

11. The method of claim 6 further comprising the step of mapping the open circuit voltage to the second state of charge.

12. A method of determining the state of charge of a lead acid battery operating in a vehicle, the method comprising:

integrating current charging and discharging the battery to determine a first state of charge measurement;

adjusting the first state of charge measurement using a Peukert relationship;

measuring the open circuit voltage to determine a second state of charge measurement by using a set of data points mapping open circuit voltage to state of charge for the battery; and determining which of the first state of charge measurement or the second state of charge measurement more accurately represents the actual state of charge of the battery.

13. The method of claim 12 wherein the vehicle is a hybrid electric vehicle.

14. The method of claim 13 wherein the vehicle is an electric vehicle.

15. The method of claim 12 further comprising the step of determining the second state of charge measurement during discharge conditions for the battery.

16. The method of claim 12 further comprising the step of compensating the second state of charge measurement based on voltage shifts after charging of the battery.

17. The method of claim 12 further comprising the step of compensating the second state of charge measurement based on battery resistance changes.

* * * * *